United States Patent [19]

Oda

[11] Patent Number: 5,548,176

[45] Date of Patent: Aug. 20, 1996

[54] ULTRASONIC MOTOR AND ULTRASONIC CONVEYING DEVICE

[75] Inventor: Takahiro Oda, Tokyo, Japan

[73] Assignee: Oki Electric Industry Co., Ltd., Tokyo, Japan

[21] Appl. No.: 302,929

[22] PCT Filed: Feb. 4, 1994

[86] PCT No.: PCT/JP94/00173

§ 371 Date: Sep. 22, 1994

§ 102(e) Date: Sep. 22, 1994

[87] PCT Pub. No.: WO94/18750

PCT Pub. Date: Aug. 18, 1994

[30] Foreign Application Priority Data

Feb. 5, 1993 [JP] Japan .................................. 5-018604

[51] Int. Cl.$^6$ ........................................................ H02N 2/00
[52] U.S. Cl. ............................................ 310/328; 310/323
[58] Field of Search ........................................ 310/317, 323, 310/328

[56] References Cited

U.S. PATENT DOCUMENTS

| | | | |
|---|---|---|---|
| 4,019,073 | 4/1977 | Vishnevsky | 310/328 |
| 4,703,214 | 10/1987 | Mishiro | 310/328 |
| 4,705,980 | 11/1987 | Mishiro | 310/323 |
| 4,947,076 | 8/1990 | Kumada | 310/323 |
| 4,975,614 | 12/1990 | Honda | 310/323 |
| 5,008,581 | 4/1991 | Kumada | 310/323 |
| 5,410,204 | 4/1995 | Imabayashi et al. | 310/323 |

*Primary Examiner*—Thomas M. Dougherty
*Attorney, Agent, or Firm*—Wenderoth, Lind & Ponack

[57] ABSTRACT

A ultrasonic motor includes, an electro-mechanical energy transducer element fixed to a predetermined portion of a stepped cylindrical elastic body to generate larger torque and stabilize rotation. The stepped cylindrical elastic body includes attachment portions between fixing portions at opposite ends thereof. A plurality of modes of vibration are generated by applying alternating voltages which are different in phase from one another to the electro-mechanical energy transducer element. A pair of cylindrical elastic bodies clamping the electro-mechanical energy transducer element therebetween are fixed to the stepped cylindrical elastic body. As a result, rotation or elliptical vibrations are generated at free ends of the cylindrical elastic bodies. Driving rollers pressed on the free ends are rotated by the rotation or elliptical vibrations. Force applied to the cylindrical elastic bodies is received by the electro-mechanical energy transducer element.

9 Claims, 8 Drawing Sheets

ULTRASONIC MOTOR AND ULTRASONIC CONVEYING DEVICE

FIELD OF THE INVENTION

The present invention relates to an ultrasonic motor and an ultrasonic conveying device using an electro-mechanical transducer element.

BACKGROUND TECHNOLOGY

Prepaid cards used for an automatic cash dispenser, a telephone, an automatic ticket publisher, etc. or papers, films and the like used for a printer, a facsimile, a copier, etc. (referred to as "sheet-type objects" hereinafter) are conventionally conveyed by a ultrasonic motor which conveys the sheet-type objects by resonating a prism vibrator made of a metal prism in flexural vibration with its resonance frequency, thereby to rotate cup-shaped rollers provided at both opposite ends of the prism vibrator (refer to Japanese Patent Laid-Open Publication Nos. 1-274674 and 1-274675).

Figure 2:
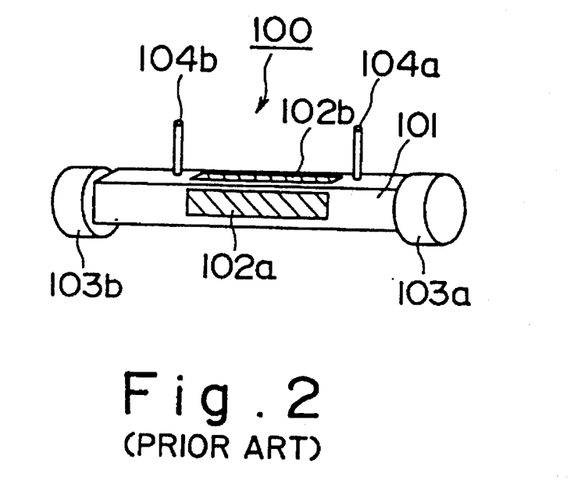
FIG. 2 is a perspective view of a piezoelectric vibrator used in a conventional ultrasonic motor.

FIG. 2 is a perspective view of a piezoelectric vibrator used by a conventional ultrasonic motor.

In such figure, denoted at 100 is a piezoelectric vibrator, which comprises a metal prism 101 having a substantially square-shaped cross section and piezoelectric ceramic thin plates 102a and 102b bonded to two adjacent side surfaces of the piezoelectric vibrator 100. The piezoelectric ceramic thin plates 102a and 102b are polarized in the direction of thickness and electrodes, not shown, are formed on the outer facing and back surfaces thereof. When an alternating voltage is applied to the piezoelectric ceramic thin plates 102a and 102b from the electrodes according to a predetermined method, an electric field is generated to make the piezoelectric ceramic thin plates 102a and 102b expand and contract to vibrate. In this case, since the metal prism 101 has substantially a square cross section, it effects flexural vibrations having resonance frequencies substantially equal to each other in directions perpendicular to each other.

When alternating voltages the frequencies of which are equal to the resonance frequency of the metal prism 101 and which are different in phase from each other by 90° are applied to the piezoelectric ceramic thin plates 102a and 102b, both ends of the metal prism 101 effect rotating vibration or elliptical vibrations. The metal prism 101 is equipped with discs 103a and 103b at opposite ends thereof and supporting pins 104a and 104b at the nodes of flexural vibration generated therein to be stably supported thereby.

Figure 3:
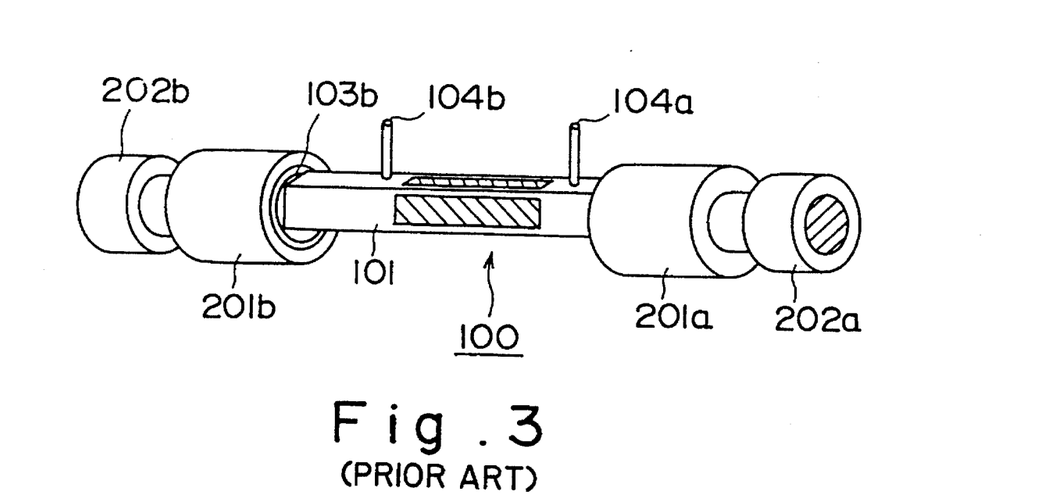
FIG. 3 is a perspective view of a conventional ultrasonic motor.

FIG. 3 is a perspective view of a conventional ultrasonic motor.

In such figure, denoted at 100 is a piezoelectric vibrator, 101 is a metal prism, 103b is a disc and 104a and 104b are supporting pins.

Cup-shaped rollers 201a and 201b each having an inner diameter slightly larger than the outer diameter of discs 103a and 103b are provided on the outer periphery of discs 103a (FIG. 2) and 103b mounted on opposite ends of the metal prism 101. As a result, the rotating or elliptical vibrations of the opposite ends of the metal prism 101 bring the discs 103a and 103b into contact with the cup-shaped rollers 201a and 201b to rotate the same by friction. The cup-shaped rollers 201a and 201b are rotatably supported by bearings 202a and 202b respectively.

Figure 4:
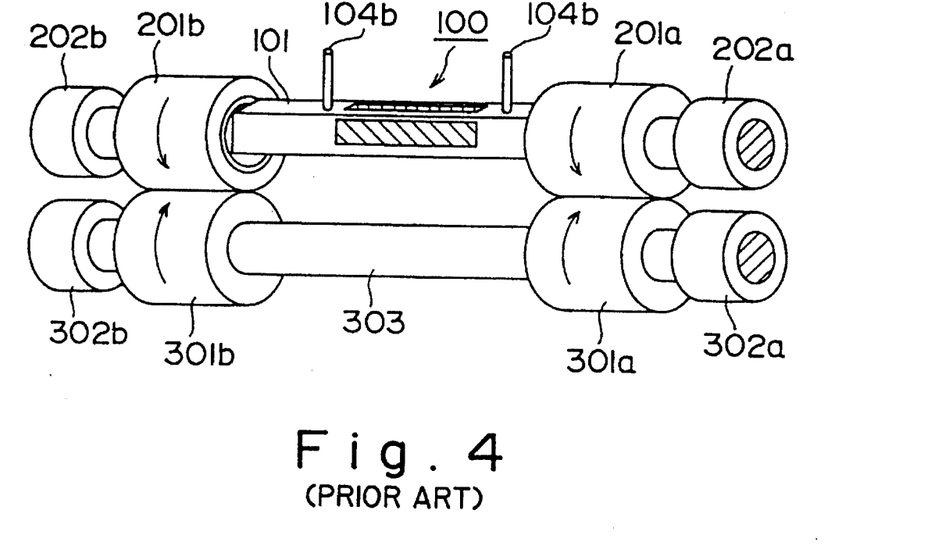
FIG. 4 is a perspective view of a conventional ultrasonic conveying device.

FIG. 4 is a perspective view of a conventional ultrasonic transfer device.

In such figure, denoted at 100 is a piezoelectric vibrator, 101 is a metal prism, 104b are supporting pins, 201a and 201b are cup-shaped rollers and 202a and 202b are bearings.

Auxiliary rollers 301a and 301b which are rotatably supported by bearings 302a and 302b are provided in such a way as to press on the cup-shaped rollers 201a and 201b. The auxiliary rollers 301a and 301b are connected to each other by way of a shaft 303.

The rotating or elliptic vibrations at the opposite ends of the metal prism 101 rotates the cup-shaped rollers 201a and 201b thereby to rotate the auxiliary rollers 301a and 301b following thereto. As a result, if a sheet-type object, not shown, is inserted between the cup-shaped rollers 201a and 201b and the auxiliary rollers 301a and 301b, such object can be easily conveyed.

The conventional ultrasonic motor and ultrasonic conveying device, however, cannot receive a force applied to the metal prism 101 by the expanding and contracting vibration of the piezoelectric ceramic thin plates 102a and 102b. Thus, a force applied to the metal prism 101 as the cup-shaped rollers 201a and 201b press on the discs 103a and 103b does not conform in direction to that applied to the metal prism 101 by the expansion and contraction of the piezoelectric ceramic thin plates 102a and 102b during conveyance of the sheet-type objects. Accordingly, when the cup-shaped rollers 201a and 201b press the discs 103a and 103b more strongly, they influence the bending rigidity of the metal prism 101 and bonding strength between the metal prism 101 and the piezoelectric ceramic thin plates 102a and 102b. This causes fluctuation in resonance frequency and amplitude of rotating and elliptical vibrations, resulting in failure to generate a larger torque.

Moreover, since the metal prism 101 and cup-shaped rollers 201a and 201b are individually supported, it is difficult to correctly position the ultrasonic motor and ultrasonic conveying device relative to each other in mounting the same to various devices. This can cause uneven rotation of the cup-shaped rollers 201a and 201b.

It is the object of the present invention to solve the problems of the conventional ultrasonic motor and ultrasonic conveying device set forth above and to provide an ultrasonic motor and an ultrasonic conveying device capable of generating larger torque and stabilizing the rotation thereof.

SUMMARY OF THE INVENTION

An ultrasonic motor according to the present invention comprises a stepped cylindrical elastic body opposite having fixing portions at both ends thereof and screwing or attachment portions therebetween and an electro-mechanical energy transducer element for generating modes of vibration (referred to as vibration modes hereinafter) in a plurality of planes upon reception of a plurality of alternating voltages which are different in phase from one another, the electro-mechanical energy transducer element being fixed to a given portion of the stepped cylindrical elastic body.

A pair of cylindrical elastic bodies are provided to clamp the electro-mechanical energy transducer element therebetween and are fixed to the stepped cylindrical elastic body. As a result, rotation or elliptical vibrations are generated at free ends of the cylindrical elastic bodies.

Since driving rollers are pressed against the free ends of the cylindrical elastic bodies, they are rotated by the rotation or elliptical vibrations generated at the free ends of the cylindrical elastic bodies.

In such case, force applied to the cylindrical elastic bodies by the driving rollers is received by the electro-mechanical energy transducer element to prevent the rotation or elliptical vibration from fluctuating in resonance frequency and amplitude, so that it is possible to make the driving rollers generate a large torque.

When the electro-mechanical energy transducer element is formed of an element body, the element body is composed of at least three polarized portions each polarized in the direction of thickness, and a plurality of alternating voltages having phases different from one another by a predetermined phase are applied to respective of the polarized portions.

In such case, at least one polarized portion is electrically connected to a switching means or selector means for switching between electric input and output, wherein the switching means selectively performs driving the electro-mechanical energy transducer element and detecting the vibrating state thereof. The rotation of the driving rollers can be stabilized by controlling the alternating voltages corresponding to the vibrating state.

In case the electro-mechanical energy transducer element is a composite element formed by laminating a plurality of element bodies of individual elements, each element body is divided into at least two portions polarized in the direction of thickness. A plurality of alternating voltages which are different from one another by a given phase are applied to the corresponding polarized portions of each element body.

At least one element body is electrically connected to a switching means for switching between an electrical input and output to selectively perform driving the electro-mechanical energy transducer element and detecting the vibrating state thereof. The rotation of the driving rollers can be stabilized by controlling the alternating voltages corresponding to the vibrating state.

A synchronizing means can be provided for synchronizing the rotations of the driving rollers to prevent them from becoming different in speed. It is also possible to provide rollers driven by the driving rollers and set the strength of force which can be transmitted between the driving rollers and the driven rollers smaller than that transmitted between the free ends and the driving rollers.

Moreover, the ultrasonic conveying device according to the present invention is provided with auxiliary rollers which face the driving rollers at positions to clamp a sheet-type object therebetween to convey the same. When the driving rollers are rotated by the rotation or elliptical vibration, the sheet-type objects are conveyed sheet by sheet separately.

Since the electro-mechanical energy transducer element receives force applied to the cylindrical elastic bodies by the driving rollers, the driving rollers can generate a large torque without fluctuation in the resonance frequency and amplitude of the rotation or elliptical vibration. As a result, it is possible to stably convey the sheet-type objects.

BRIEF DESCRIPTION OF THE DRAWINGS

FIGS. 6(*a*)–6(*d*) are diagrams showing the vibration modes of the cylindrical vibrator according to the first embodiment of the present invention;

FIGS. 13(*a*) and 13(*b*) are schematic views of a laminated-type electro-mechanical energy transducer element according to a third embodiment of the present invention.

DETAILED DESCRIPTION OF THE INVENTION

Embodiments of the present invention hereinafter will described with reference to drawings.

Figure 1:
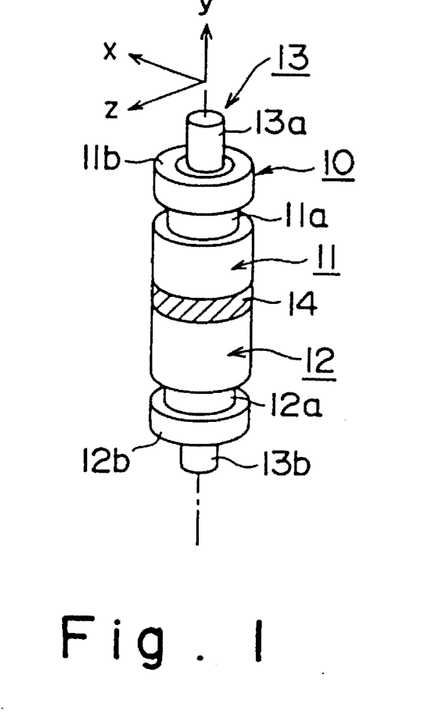
FIG. 1 is an perspective view of a cylindrical vibrator used in a ultrasonic motor according to a first embodiment of the present invention.
Figure 5:
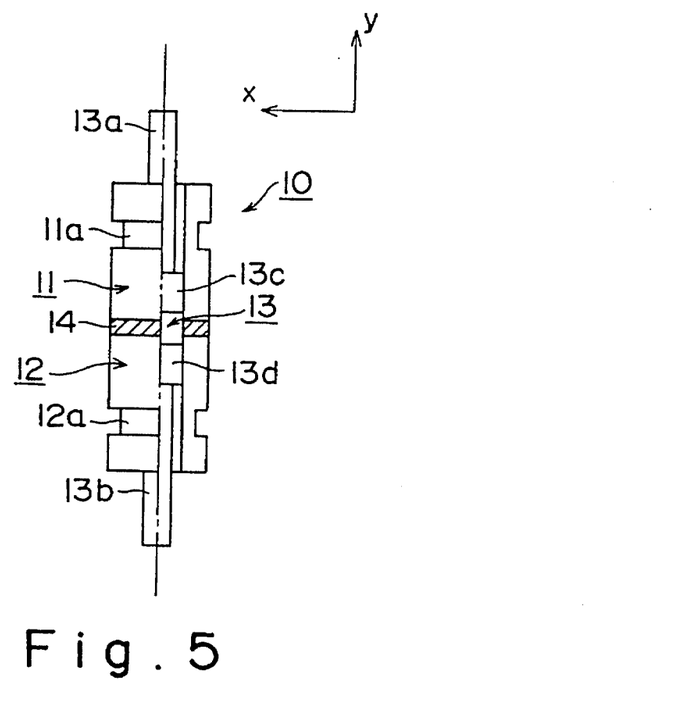
FIG. 5 is a side view of the cylindrical vibrator used in an ultrasonic motor according to the first embodiment of the present invention.

FIG. 1 is a perspective view of a cylindrical vibrator used in a ultrasonic motor according to a first embodiment of the present invention, FIG. 5 is a side view of the cylindrical vibrator used in the ultrasonic motor according to the first embodiment of the present invention, FIGS. 6(*a*)–6(*b*) are views showing vibration modes of the cylindrical vibrator according to the first embodiment of the present invention, wherein FIG. 6(*a*) shows first vibration mode thereof, FIG. 6(*b*) shows a second vibration mode thereof, FIG. 6(*c*) shows a third vibration mode thereof and FIG. 6(*d*) shows a fourth vibration mode thereof.

In FIGS. 1 and 5, denoted at 10 is a cylindrical vibrator, which comprises a pair of cylindrical elastic bodies 11 and 12 for clamping an electro-mechanical energy transducer element 14 therebetween, each of the cylindrical elastic bodies 11 and 12 being screwed to a stepped cylindrical elastic body 13 provided inside the cylindrical vibrator 10. The electro-mechanical energy transducer element 14 having a hole at the central portion thereof is divided into a plurality of pieces each being polarized in the direction of thickness thereof.

The stepped cylindrical elastic body 13 comprises fixing portions 13*a* and 13*b* and screwing portions 13*c* and 13*d*, the screwing portions 13*c* and 13*d* being threaded at the external circumferences thereof and the cylindrical elastic bodies 11 and 12 being threaded at the internal circumferences thereof to facilitate the connecting operation thereof. The cylindrical vibrator 10 vibrates when an alternating voltage is applied to the electro-mechanical energy transducer element 14 by way of leads, not shown.

When each of the cylindrical elastic bodies 11 and 12 is threadedly connected to the stepped cylindrical elastic body 13, each of the cylindrical elastic bodies 11 and 12 and stepped cylindrical elastic body 13 are electrically isolated from the electro-mechanical energy transducer element 14.

Figure 6A:
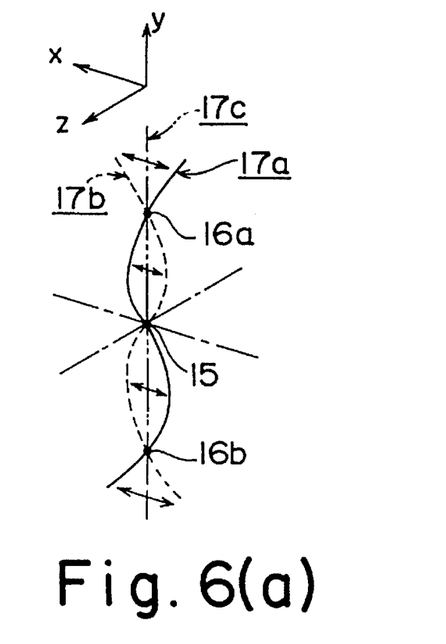
Figure 6B:
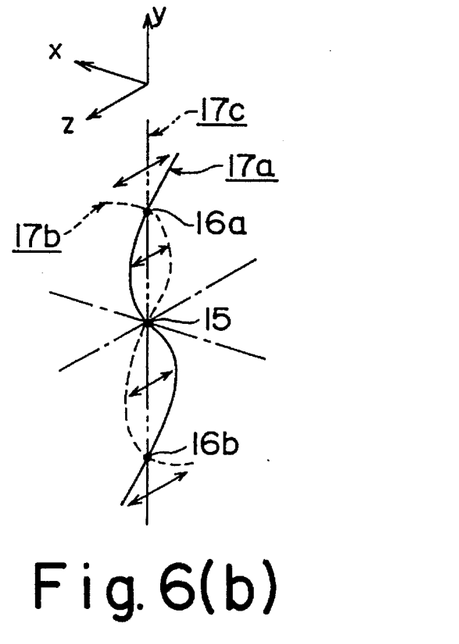
Figure 6C:
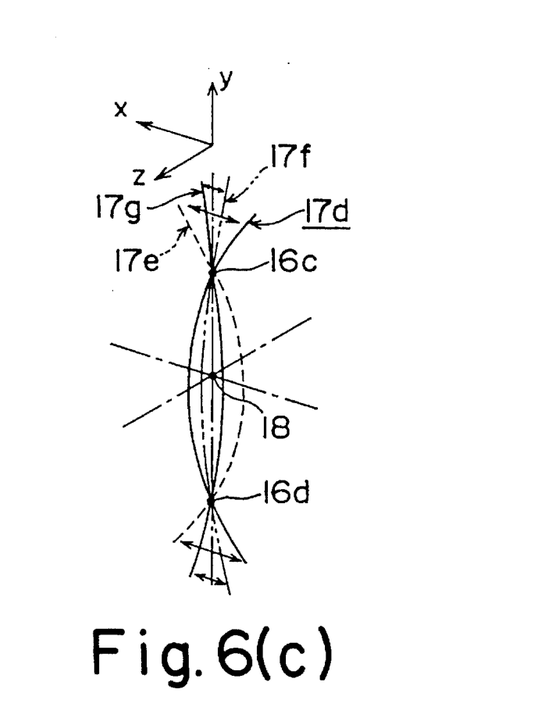
Figure 6D:
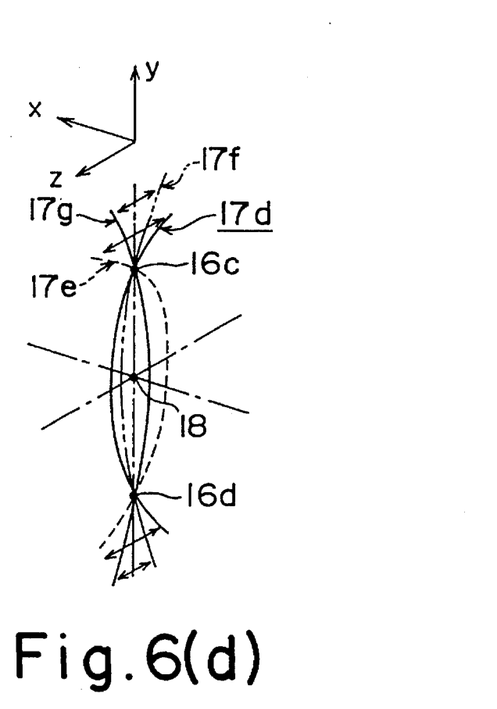

When the stepped cylindrical elastic body 13 is fixed to an ultrasonic conveying device body, not shown, at the screwing portions 13c and 13d thereof and an alternating voltage is applied to the electro-mechanical energy transducer element 14, the cylindrical vibrator 10 vibrates in four vibration modes illustrated in FIGS. 6(a) to 6(d). That is, the flexural vibration in an x-y plane of the electro-mechanical energy transducer element 14 itself causes flexural vibrations of the cylindrical vibrator 10 as illustrated in FIGS. 6(a) and 6(b), while vertical vibration in the direction of the y-axis of the electro-mechanical energy transducer element 14 itself causes flexural vibrations of the cylindrical vibrator 10 as illustrated in FIGS. 6(c) and 6(d).

In the first vibration mode illustrated in FIG. 6(a), secondary flexural vibration in the x-y plane of the cylindrical elastic bodies 11 and 12 causes the formation of a node 15 at the electro-mechanical energy transducer element 14 which serves as a connecting portion for the cylindrical elastic bodies 11 and 12 and the formation of nodes 16a and 16b at notched portions 11a and 12a in the cylindrical elastic bodies 11 and 12 respectively. In such figure, a solid line 17a and a broken line 17b represent the flexural vibrations of the cylindrical elastic bodies 11 and 12 respectively.

On the other hand, the stepped cylindrical elastic body 13 scarcely vibrates as represented by a two-dot chain line 17c since it is in contact with the cylindrical elastic bodies 11 and 12 at the node 15 thereof. As a result, the cylindrical resonator 10 can be supported at both end fixing portions 13a and 13b of the stepped cylindrical elastic body 13 to reduce energy loss at supporting portions.

In the second vibration mode illustrated in FIG. 6(b), secondary flexural vibration in a y-z plane of the cylindrical elastic bodies 11 and 12 causes the formation of a node 15 at the electro-mechanical energy transducer element 14 which serves as the connecting portion for the cylindrical elastic bodies 11 and 12 and the formation of nodes 16a and 16b at the notched portions 11a and 12a in the cylindrical elastic bodies 11 and 12 respectively. In such figure, the solid line 17a and broken line 17b represent the flexural vibrations of the cylindrical elastic bodies 11 and 12.

On the other hand, also in this case, the stepped cylindrical elastic body 13 scarcely vibrates as represented by the two-dot chain line 17c in the since it is in contact with the cylindrical elastic bodies 11 and 12 at the node 15 similarly to the first vibration mode. As a result, the cylindrical vibrator 10 can be supported at both end fixing portions 13a and 13b of the stepped cylindrical elastic body 13 to reduce energy loss at supporting portions.

Rotation or elliptical vibrations can be generated at the free ends 11b and 12b of the cylindrical elastic bodies 11 and 12 by setting the resonance frequencies of secondary flexural vibrations of the cylindrical elastic bodies 11 and 12 in the first and second vibration modes to conform to or be sufficiently close to each other, to have the nodes 15, 16a and 16b of vibration of the cylindrical vibrator 10 at a position or at positions sufficiently close to each other and to differ in phase from each other by 90°.

The notched portions 11a and 12a are formed at positions conforming to or sufficiently close to those of the nodes 16a and 16b of the cylindrical elastic bodies 11 and 12 respectively in order to facilitate the rotation or elliptical vibrations of the free ends 11b and 12b thereof.

In the third vibration mode illustrated in FIG. 6(c), primary flexural vibration in the x-y plane of the cylindrical elastic bodies 11 and 12 causes the formation of nodes 16c and 16d at the notched portions 11a and 12a of the cylindrical elastic bodies 11 and 12. In this figure, a solid line 17d and a broken line 17e represent the flexural vibrations of the cylindrical elastic bodies 11 and 12.

On the other hand, the stepped cylindrical elastic body 13 vibrates as represented by a two-dot chain line 17f and a solid line 17g, since it is in contact with the cylindrical elastic bodies 11 and 12 at an antinode 18 of vibration thereof. In this case, the cylindrical vibrator 10 can be supported at the fixing portions 13a and 13b at both ends of the stepped cylindrical elastic body 13 to reduce energy loss at supporting portions by selecting the dimension of the step or material of the stepped cylindrical elastic body 13 to reduce the amplitude of vibration at both ends thereof represented by the two-dot chain line 17f and solid line 17g or machining the portions of the stepped cylindrical elastic body 13 and cylindrical elastic bodies 11 and 12 which are in contact with each other to prevent the stepped cylindrical elastic body 13 from being excited by the vibration represented by the solid line 17d and broken line 17e.

In the fourth vibration mode illustrated in FIG. 6(d), primary flexural vibration in the y-z plane of the cylindrical elastic bodies 11 and 12 causes the formation of nodes 16c and 16d at the notched portions 11a and 12a of the cylindrical elastic bodies 11 and 12. A solid line 17d and a broken line 17e represent the flexural vibrations of the cylindrical elastic bodies 11 and 12.

On the other hand, the stepped cylindrical elastic body 13 vibrates as represented by the two-dot chain line 17f and solid line 17g, since it is in contact with the cylindrical elastic bodies 11 and 12 at the antinode 18 of vibration thereof similarly to the third vibration mode. The cylindrical vibrator 10 can be supported at the fixing portions 13a and 13b at both ends of the stepped cylindrical elastic body 13 to reduce energy loss at the supporting portions by selecting the dimension of the step or material of the stepped cylindrical elastic body 13 to reduce the amplitude of vibration at both ends thereof as represented by the two-dot chain line 17f and solid line 17g or machining the portions of the stepped cylindrical elastic body 13 and the cylindrical elastic bodies 11 and 12 which are in contact with each other to prevent the stepped cylindrical elastic body 13 from being excited by the vibration represented by the solid line 17d and broken line 17e.

Primary flexural vibrations of the cylindrical elastic bodies 11 and 12 set to be equal or sufficiently close to each other in resonance frequency, to have the nodes 16c and 16d at a position or at positions sufficiently close to each other and to differ in phase by 90° in the third and fourth vibration modes can generate rotation or elliptical vibrations at the free ends 11b and 12b of the cylindrical elastic bodies 11 and 12.

The notched portions 11a and 12a are formed at positions conforming to or sufficiently close to those of the nodes 16c and 16d of the cylindrical elastic bodies 11 and 12 respectively in order to facilitate the rotation or elliptical vibrations of the free ends 11b and 12b thereof.

The first and second vibration modes take advantage of a lateral effect when the direction of polarization of the electro-mechanical energy transducer element 14 is perpendicular to that of vibration, while the third and fourth vibration modes take advantage of a longitudinal effect when the direction of polarization of the electro-mechanical energy transducer element 14 conforms to that of vibration. Accordingly, the third and fourth vibration modes can increase an electro-mechanical coupling coefficient to improve energy utilization efficiency more than the first and second modes.

Since the cylindrical vibrator 10 can be regarded as a body of revolution in which the y-axis is the axis of revolution, it is possible to allow the cylindrical vibrator 10 to vibrate in an arbitrary plane containing the y-axis therein without being limited to the x-y and y-z planes in the first to fourth vibration modes. That is, when the electro-mechanical energy transducer element 14 is divided into m polarized portions each polarized in the direction of thickness to form m uniform vibration modes in m directions in the x-z plane containing the node 15 or the antinode 18 therein, the vibration modes adjacent to each other being different in phase by $2\pi/m$, the cylindrical elastic bodies 11 and 12 can similarly generate rotation or elliptical vibrations at the free ends 11b and 12b thereof.

In this case, when the value of m is odd to establish the equation:

$$m=2n+1 \text{ (n:integer)},$$

the polarized portions of the electro-mechanical energy transducer element 14 are arranged asymmetrical to one another relative to the y-axis, so that it is necessary to conform them in polarity. Accordingly, the electro-mechanical energy transducer element 14 needs m input terminals to the polarized portions thereof and a ground terminal. On the other hand, when the value of m is even to establish the equation:

$$m=2(n+1),$$

the polarized portions of the electro-mechanical energy transducer element 14 are arranged symmetrical to one another relative to the y-axis. Accordingly, when a pair of polarized portions, which are symmetrical to each other with regard to the y-axis and reverse to each other in polarization, are electrically connected to each other so that one may be expanded while the other may be contracted when a voltage of the same polarity is applied thereto, the number of the input terminals to the polarized portions can be reduced to m/2 excluding a ground terminal.

In the cylindrical vibrator 10 set forth above, the electro-mechanical energy transducer element 14 is arranged at a position conforming to or sufficiently close to the position of the node 15 or the antinode 18 and is clamped between the cylindrical elastic bodies 11 and 12 using the screwing portions 13c and 13d of the stepped cylindrical elastic body 13 so as to incorporate the stepped cylindrical elastic body 13, the electro-mechanical energy transducer element 14 and the cylindrical elastic bodies 11 and 12 into one piece.

The screwing portions 13c and 13d and fixing portions 13a and 13b of the stepped cylindrical elastic body 13 are different in cross section to increase the amplitude of rotation or elliptical vibrations generated at the free ends 11b and 12b of the cylindrical elastic bodies 11 and 12.

In assembling the cylindrical vibrator 10, if the stepped cylindrical elastic body 13 is made of conductive metal material, the electro-mechanical energy transducer element 14 is electrically in contact with the stepped cylindrical elastic body 13 so that the input terminals to the electro-mechanical energy transducer element 14 and the ground terminal are short-circuited to each other and consequently electric energy cannot be converted into mechanical energy. Accordingly, insulating films are attached to the portions of the stepped cylindrical elastic body 13 and electro-mechanical energy transducer element 14 which are in contact with one another to prevent such electric contact. A similar effect can be obtained also by forming the stepped cylindrical elastic body 13 of nonconductive metallic material.

The portions of stepped cylindrical elastic body 13 to which the driving rollers, described below, are attached and the free ends 11b and 12b of the cylindrical elastic bodies 11 and 12 respectively generate rotation or elliptical vibrations each composed of vibrations different in phase from each other. The phase difference at that time influences friction generated when the driving rollers receive the rotation or elliptical vibration from the free ends 11b and 12b to fluctuate the torque of the driving rollers. Theoretically, the torque of the driving rollers is maximum when the phases are different from each other by 180°. As a result, the shape of the step, dimension and material of the stepped cylindrical elastic body 13, the dimensions of the cylindrical elastic bodies 11 and 12 and those of the notched portions 11a and 12a are determined to make the phases different from each other by 180°.

Figure 7:
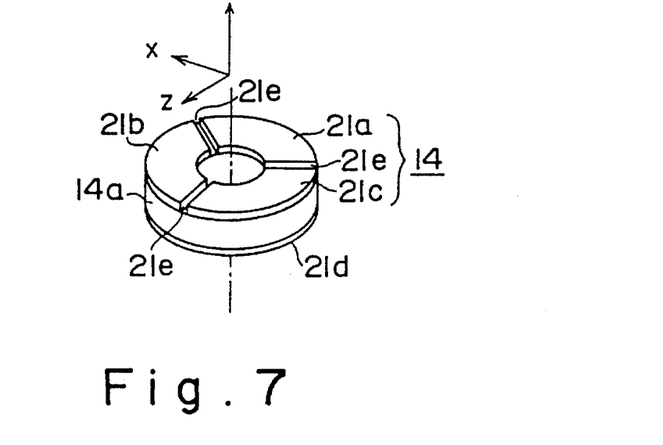
FIG. 7 is a schematic view of an electro-mechanical energy transducer element according to the first embodiment of the present invention.

FIG. 7 is a schematic view of an electro-mechanical energy transducer element according to a first embodiment of the present invention.

In such figure, denoted at 14 is an electro-mechanical energy transducer element composed of an element body 14a and electrode films 21a to 21d, the element body 14a being divided into three polarized portions each polarized in the direction of thickness. The electrode films 21a to 21c are attached to a surface of the element body 14a at positions corresponding to the polarized portions with gaps 21e between one another, and electrode film 21d which is of the same quality as the electrode films 21a to 21c is uniformly attached to the other surface of the element body 14a. It is also possible to attach the electrode films to both sides of the element body 14a corresponding to the polarized portions thereof. Moreover, it is also possible to form the electrode films 21a to 21d on the surfaces of the element body 14a corresponding to polarized portions by applying a conductive coating thereon.

The polarized portions are polarized in the same direction. E.g., in case the polarity of surfaces of the electrode films 21a to 21c is positive, that of the electrode film 21d is negative. In this case, when a direct voltage is applied to the electrode films 21a to 21c while the electrode film 21d is grounded, the element body 14a expands in the direction of the y-axis or bends in the positive direction of the y-axis. The amount of expansion or bending is proportional to the direct voltage applied thereto.

Figure 8:
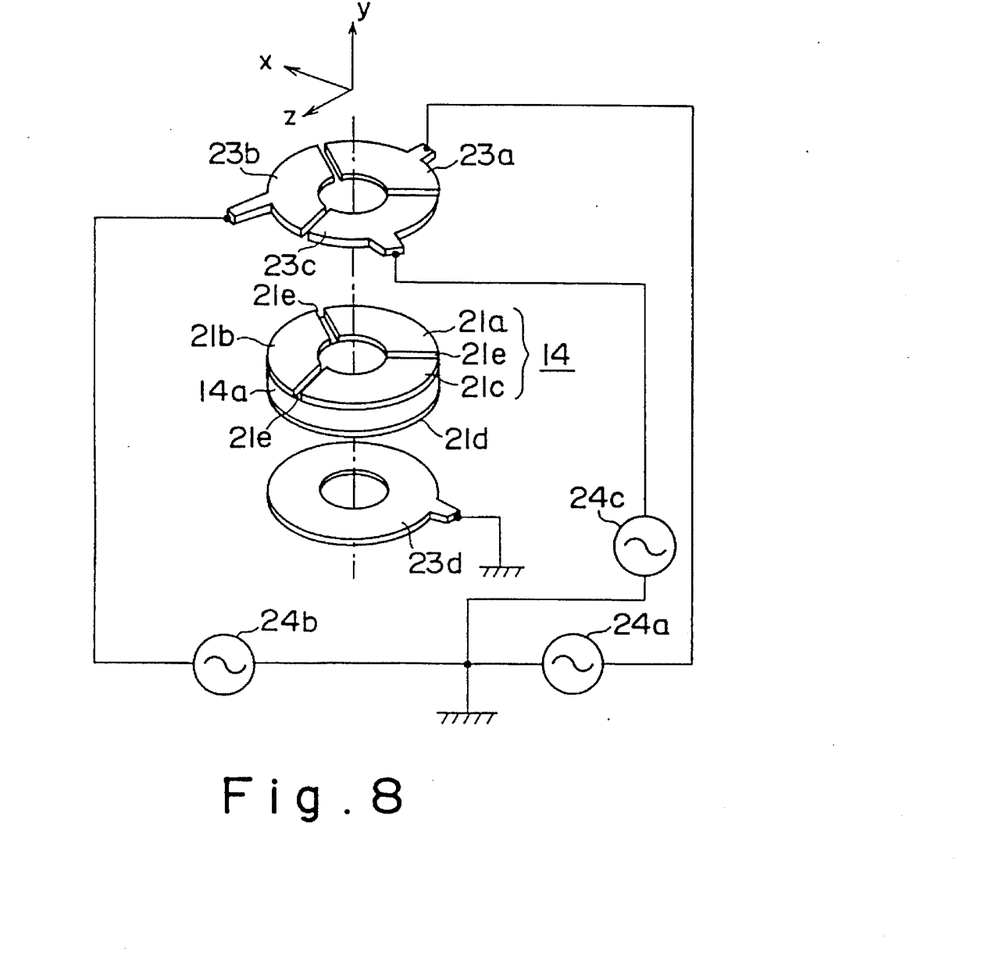
FIG. 8 is a schematic view illustrating principle of the electro-mechanical energy transducer element according to the first embodiment of the present invention.

FIG. 8 illustrates the working principle of the electro-mechanical energy transducer element according to the first embodiment of the present invention.

In such figure, denoted at 14 is the electro-mechanical energy transducer element, 14a is the element body, 21a to 21d are electrode films, 21e are gaps, 23a to 23d are electrode plates and 24a to 24c are power sources.

The electrode plates 23a to 23d which correspond to the electrode films 21a to 21d of the electro-mechanical energy transducer element 14 and are arranged as illustrated are brought into contact with the electrode films 21a to 21d. At that time, the electrode plates 23a to 23d and the electrode films 21a to 21d are made of the same material taking into consideration the efficiency of transmitting vibration from the electro-mechanical energy transducer element 14 to the cylindrical elastic bodies 11 and 12 (FIG. 1). The same effect can be also obtained by differing the material of the electrode plates 23a to 23d from that of the cylindrical elastic bodies 11 and 12. The electrode plates 23a to 23d should be as thin as possible compared with the element body 14a and should be larger than the electrode films 21a to 21d respectively.

Electrode plates 23a to 23c are separated by gaps larger than the gaps 21e separating the electrode films 21a to 21c, from one another are formed to separate the electrode plates 23a to 23c thus preventing electrode plates 23a to 23c from being in contact with one another. Insulating materials may be provided between the electrode plates 23a to 23c and incorporated into one piece. In such case, positioning the electrode plates 23a to 23c relative to the electrode films 21a to 21c becomes easier than the case in which three individual electrode plates 23a to 23c are used separately. An outward projecting electrode piece is formed in each of the electrode plates 23a to 23d, and the electrode pieces are electrically connected to one another as illustrated.

The three polarized portions of the electro-mechanical energy transducer element 14 are the same in polarity. Accordingly, alternating voltages applied to the electrode plates 23a to 23c from the power sources 24a to 24c are set to be different in phase from one another by 120°. It is possible to amplify the vibration of the electro-mechanical energy transducer element 14 to generate rotation or elliptical vibrations at the free ends 11b and 12b of the cylindrical elastic bodies 11 and 12 by setting the frequency values of the alternating voltages to conform to or be sufficiently close to the resonance frequencies of the first to fourth vibration modes. The amplitude of the rotation or elliptical vibration generated at the free ends 11b and 12b can be controlled by the magnitude, phase difference, frequency and the like of the alternating voltages applied from the power sources 24a to 24c.

In case the electro-mechanical energy transducer element 14 is composed of an element that can convert mechanical energy into electric energy as well as electric energy into mechanical energy, an alternating current is applied to one of the polarized portions of the electro-mechanical energy transducer element 14 to generate a rotation or elliptical vibration while other polarized portions output alternating voltages upon reception of stress caused by the rotation or elliptical vibration.

Accordingly, each polarized portion of the electro-mechanical energy transducer element 14 can be electrically switched to be used for driving the same or for detecting the vibrating state thereof. It is possible to compensate for a change over time or a change due to an external load in the rotation or elliptical vibration generated at the free ends 11b and 12b of the cylindrical elastic bodies 11 and 12 to stabilize the vibration. It is possible to use the electro-mechanical energy transducer element 14 for driving the same or for detecting the vibrating state of the cylindrical vibrator 10 by way of a selector switch or selector means not shown, which connects the terminals of the polarized portions, not shown, to a control circuit or other power source, not shown.

In case the stepped cylindrical elastic body 13 is composed of conductive metallic material, the electrode plates 23a to 23d are brought into contact with the stepped cylindrical elastic body 13 in assembling the cylindrical vibrator 10 to short-circuit the input terminals for the electro-mechanical energy transducer element 14 to the ground terminal so that electric energy cannot be converted into mechanical energy. Therefore, it is possible to prevent the electrode plates 23a to 23d from electrical contact with one another by attaching insulating films to the portions of the stepped cylindrical elastic body 13 and electrode plates 23a to 23d which are in contact with one another or by changing the shapes or dimensions thereof. A similar effect can be obtained also by forming the stepped cylindrical elastic body 13 of nonconductive metallic material.

Figure 9:
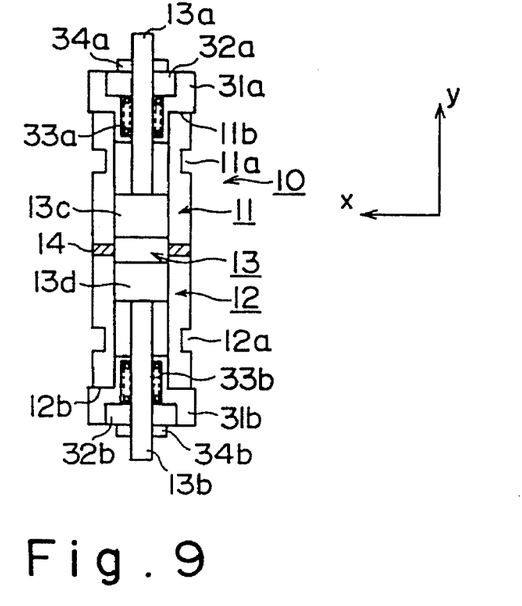
FIG. 9 is a cross-sectional view of the ultrasonic motor according to the first embodiment of the present invention.

FIG. 9 is a cross-sectional view of a ultrasonic motor according to a first embodiment of the present invention.

In such figure, denoted at 10 is a cylindrical vibrator, 11 and 12 are cylindrical elastic bodies, 11a and 12a are notched portions, 11b and 12b are free ends, 13 is a stepped cylindrical elastic body, 13a and 13b are fixing portions, 14 is an electro-mechanical energy transducer element, 31a and 31b are driving rollers, 32a and 32b are bearings, 33a and 33b are springs and 34a and 34b are lock nuts.

The driving roller 31a is rotatably supported by one fixing portion 13a of the stepped cylindrical elastic body 13 by way of the bearing 32a. The driving roller 31a is pressed on the free end 11b of the cylindrical elastic body 11 by the spring 33a provided between the bearing 32a and itself. On the other hand, the driving roller 31b is rotatably supported by the other fixing portion 13b of the stepped cylindrical elastic body 13 by way of the bearing 32b. The bearing 32b is pressed on the free end 12b of the cylindrical elastic body 12 by the spring 33b provided between the bearing 32b and itself.

The rotation or elliptical vibrations of the free ends 11b and 12b of the cylindrical elastic bodies 11 and 12 generate friction between the driving rollers 31a and 31b and the cylindrical elastic bodies 11 and 12 respectively to apply torque to the driving rollers 31a and 31b to rotate the same in the direction of the friction.

Since the rotation or elliptical vibration of the free ends 11b and 12b of the cylindrical elastic bodies 11 and 12 is symmetrical with regard to the node 15 in the first and second vibration modes, the free ends 11b and 12b vibrate in the same direction in the composite mode of the first and second vibration modes, so that the driving rollers 31a and 31b rotate in the same direction. Moreover, if the respective conditions of contact between the driving rollers 31a and 31b and the free ends 11b and 12b are the same, the free ends 11b and 12b have the same characteristic of rotation.

That is, the cylindrical vibrator 10 obtains torque from the driving rollers 31a and 31b which are rotatably supported by the stepped cylindrical elastic body 13 and are pressed on the free ends 11b and 12b of the cylindrical elastic bodies 11 and 12 respectively. As a result, it is possible to adjust the torque of the cylindrical ultrasonic motor by adjusting pressure by way of the lock nuts 34a and 34b.

Although the fixing portions 13a and 13b of the stepped cylindrical elastic body 13 are used as shafts for the driving rollers 31a and 31b respectively according to this embodiment, the shafts also can be provided outside the cylindrical vibrator 10.

Furthermore, films made of material having a high coefficient of friction and high wear resistance are attached or bonded to the surfaces of the free ends 11b and 12b or the driving rollers 31a and 31b so that the driving rollers 31a and 31b may obtain a stable rotation from the free ends 11b and 12b. It is also possible to form the cylindrical elastic bodies 11 and 12 or the driving rollers 31a and 31b themselves of materials having a high coefficient of friction and high wear resistance.

It is also possible to transmit the rotation or elliptical vibrations of the free ends 11b and 12b to the driving rollers 31a and 31b by forming geometric patterns on the surfaces of the free ends 11b and 12b and the driving rollers 31a and 31b to produce mating contact therebetween, instead of making use of friction.

Figure 10:
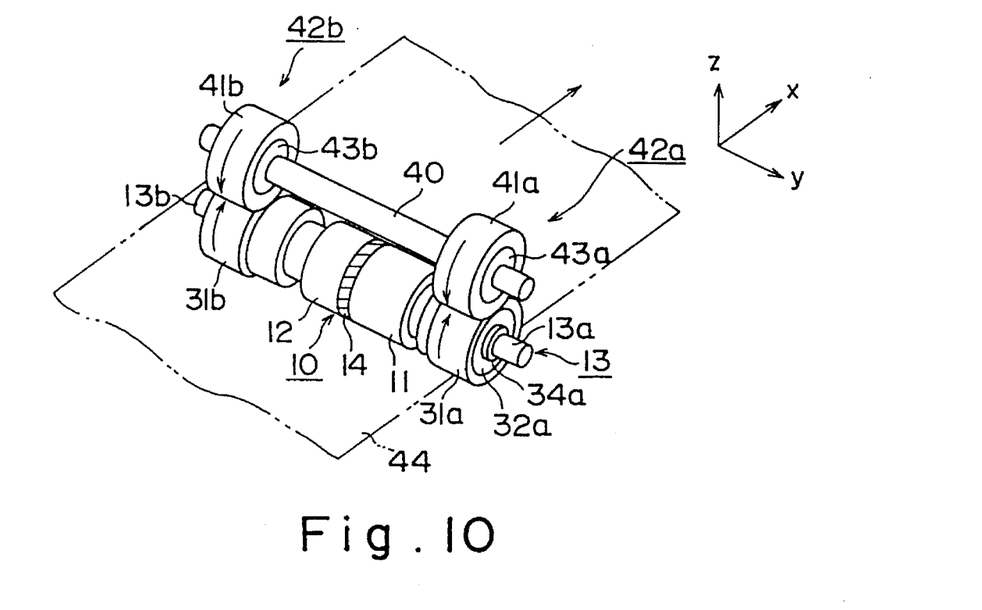
FIG. 10 is a perspective view of an ultrasonic conveying device using the ultrasonic motor according to the present invention.

FIG. 10 is a perspective view of a ultrasonic conveying device using a ultrasonic motor according to the present invention.

In such figure, denoted at 10 is a cylindrical vibrator, 11 and 12 are cylindrical elastic bodies, 13 is a stepped cylindrical elastic body, 13a and 13b are fixing portions thereof, 14 is an electro-mechanical energy transducer element, 31a and 31b are driving rollers, 32a, 32b, 43a and 43b are bearings, 34a and 34b are lock nuts, 40 is a shaft, 41a and 41b are cylindrical rollers, 42a and 42b are auxiliary rollers and 44 is a sheet-type object.

The auxiliary rollers 42a and 42b formed by bonding the cylindrical rollers 41a and 41b onto the outer circumferences of bearings 43a and 43b respectively are rotatably supported by the shaft 40 provided on the internal circumference of the bearings 43a and 43b. When the sheet-type object 44 such as a card, paper, a film, etc. is inserted between the driving rollers 31a and 31b and the auxiliary rollers 42a and 42b, such object easily can be conveyed in the direction of the x-axis. At such time, pressure applied by the auxiliary rollers 42a and 42b or reaction forces in the direction of the z-axis caused by variation of thickness of the sheet-type object 44 are applied to the cylindrical vibrator 10 by way of the driving rollers 31a and 31b, but these forces can be received by the flexural or longitudinal vibration of the electro-mechanical energy transducer element 14, so that the torque generated by the driving rollers 31a and 31b can be increased. Supporting the auxiliary rollers 42a and 42b in such a way as to let them have a degree of freedom in the direction of the z-axis can accommodate variation of thickness of the sheet-type object 44.

In case the driving rollers 31a and 31b rotate in the direction of the illustrated arrows thereof, the sheet-type object 44 is conveyed in the direction of an arrow. Each of the driving rollers 31a and 31b can be equipped with a roller, not shown, having a high coefficient of friction and high wear resistance on the outer circumference thereof. Material having a high coefficient of friction and high wear resistance is attached or bonded onto the outer circumference of each of the auxiliary rollers 42a and 42b. It is also possible to make the auxiliary rollers 42a and 42b themselves of material having a high coefficient of friction and high wear resistance.

It is possible to prevent the auxiliary rollers 42a and 42b, the driving rollers 31a and 31b and the rollers covering the latter from plastic deformation in case the cylindrical ultrasonic motor is left undriven for a long period of time by providing gaps between the driving rollers 31a and 31b and the auxiliary rollers 42a and 42b, or between the auxiliary rollers 42a and 42b and the rollers provided on the outer peripheries of the driving rollers 31a and 31b.

Moreover, it is possible to prevent the sheet-type object 44 from failing to be conveyed by controlling the gap set forth above by way of an actuator which is driven by a driving source different from that of the ultrasonic motor. Furthermore, employing an actuator which is driven by a different driving source in a mechanism for pressing the auxiliary rollers 42a and 42b toward the driving rollers 31a and 31b can also obtain a similar effect and can compensate for fluctuation of conveying force due to variation of thickness of the sheet-type object 44, thereby realize stable conveyance thereof Still furthermore, another cylindrical ultrasonic motor can be provided instead of the auxiliary rollers 42a and 42b.

Although the cylindrical ultrasonic motor is fixed and the driving rollers 31a and 31b convey the sheet-type object 44 in the embodiment set forth above, it is also possible to provide that the ultrasonic motor itself travels by rotating force of the driving rollers 31a and 31b. It can be used, for example, for moving a print head in a printer, moving a print pen in an x-y plotter, conveying a recording medium or moving a magnetic recording head inside a magnetic recording device, moving a work table in a machine tool and the like.

The rotation of the driving roller 31a and that of the driving roller 31b can be synchronized to each other by a mechanical or electrical means. That is, it is possible to prevent the generation of a difference in rotating speed between the driving rollers 31a and 31b due to fluctuation of respective contact conditions between the driving rollers 31a and 31b and the free ends 11b and 12b of the cylindrical elastic bodies 11 and 12.

In case the rotation of the driving roller 31a is to be synchronized with that of the driving roller 31b by a mechanical means, a cylindrical roller which has a diameter larger than that of the cylindrical ultrasonic motor and has an internal circumference in contact with the outer circumferences of the driving rollers 31a and 31b is provided thereby to synchronize the rotation of the driving rollers s 31a and 31b. Such provided roller and the driving rollers 31a and 31b have coaxial axes of rotation in common, and the provided roller serves as an output roller of the cylindrical ultrasonic motor.

Moreover, in such case, an electric circuit is formed or printed inside or on the outer circumference of the stepped cylindrical elastic body 13 to be capable of stably supplying electric energy to the electro-mechanical energy transducer element 14 without being influenced by rotation of the roller described above.

The above roller and the driving rollers 31a and 31b can be bonded to each other to keep them in contact with each other, or also can be subjected to machining to form geometric patterns on the surfaces thereof for producing mating contact therebetween.

Furthermore, it is also possible to provide a roller which is rotatably supported outside the cylindrical ultrasonic motor and is in contact with the driving rollers 31a and 31b.

Synchronizing the rotations of the driving roller 31a and the driving roller 31b by way of the mechanical means set forth above, however, influences the driving performance of the ultrasonic motor since the difference between the rotating speeds thereof applies loads to the driving rollers 31a and 31b and the free ends 11b and 12b at portions thereof which are in contact with each other, respectively. Accordingly, in case the free ends 11b and 12b apply friction to the driving rollers 31a and 31b, it is possible to restrain the influence upon the driving performance of the ultrasonic motor to stably rotate the driving rollers 31a and 31b by providing a friction transmission mechanism, not shown, which slides by a friction less than that between the driving rollers 31a and 31b and the free ends 11b and 12b.

Even if the driving rollers 31a and 31b and the free ends 11b and 12b have geometric patterns on the surfaces thereof for producing mating contact therebetwee, a mechanical friction transmission mechanism can be provided to arbitrarily set the value of friction at which mating is canceled sliding and sliding occurs.

On the other hand, in case the rotation of the driving roller 31a is synchronized with that of the driving roller 31b by an electric means, electromagnetic force is utilized. The electromagnetic force can be arbitrarily adjusted electrically, so that it is possible to obtain an effect similar to that of the friction transmission mechanism set forth above.

Moreover, the above methods of synchronization can be employed in combination instead of being employed individually.

A second embodiment invention of the present will be described hereinafter.

Figure 11:
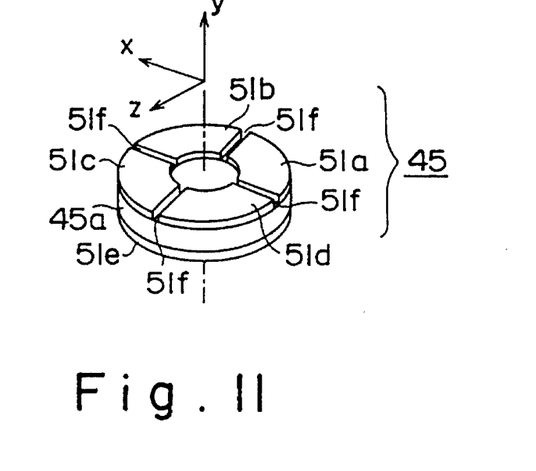
FIG. 11 is a schematic view of an electro-mechanical energy transducer element according to a second embodiment of the present invention.

FIG. 11 is a schematic view of an electro-mechanical energy transducer according to the second embodiment of the present invention.

In such figure, denoted at 45 is an electro-mechanical energy transducer composed of an element body 45a and electrode films 51a to 51d, the element body 45a being divided into four polarized portions each of which is polarized in the direction of thickness. The electrode films 51a to 51d are attached to one of the surfaces of the element body 45a at positions corresponding to the polarized portions, forming gaps 51f between adjacent electrode films, and an electrode film 51e made of the same material as that of the electrode films 51a to 51d is uniformly attached to the other surface of the element body 45a. Moreover, it is also possible to form the electrode films 51a to 51e by applying conductive coatings onto the surfaces of the electro-mechanical energy transducer 45 at the portions thereof corresponding to the polarized portions.

In case the polarized portions are conformed to one another in polarity in the electro-mechanical energy transducer element 45 having the above arrangement, the polarity of the surface of the electrode film 51e becomes negative supposing that the polarity of the surfaces of the electrode films 51a to 51d is positive. If a dc voltage is applied to the electrode films 51a to 51d while the electrode film 51e is grounded, The element body 45a expands in the direction of the y-axis or bends in the positive direction of the y-axis. The amount of expansion or bending is proportional to the magnitude of the dc voltage. This arrangement requires four input terminals and a ground terminal.

In case a pair among the polarized portions that are symmetrical to each other with regard to the y-axis are polarized reversely to each other, the polarity of surfaces of the electrode films 51c and 51d becomes negative supposing that the polarity of the surfaces of the electrode films 51a and 51b is positive. Accordingly, if the symmetrical pair of polarized portions are electrically connected to each other, the element body 45a can have two input terminals and a ground terminal. In such case, one of the pair of polarized portions expands in the direction of the y-axis or bends in the positive direction of the y-axis, while the other contracts in the direction of the y-axis or bends in the negative direction of the y-axis. In either case, alternating voltages applied to adjacent polarized portions differ in phase by 90°.

Figure 12:
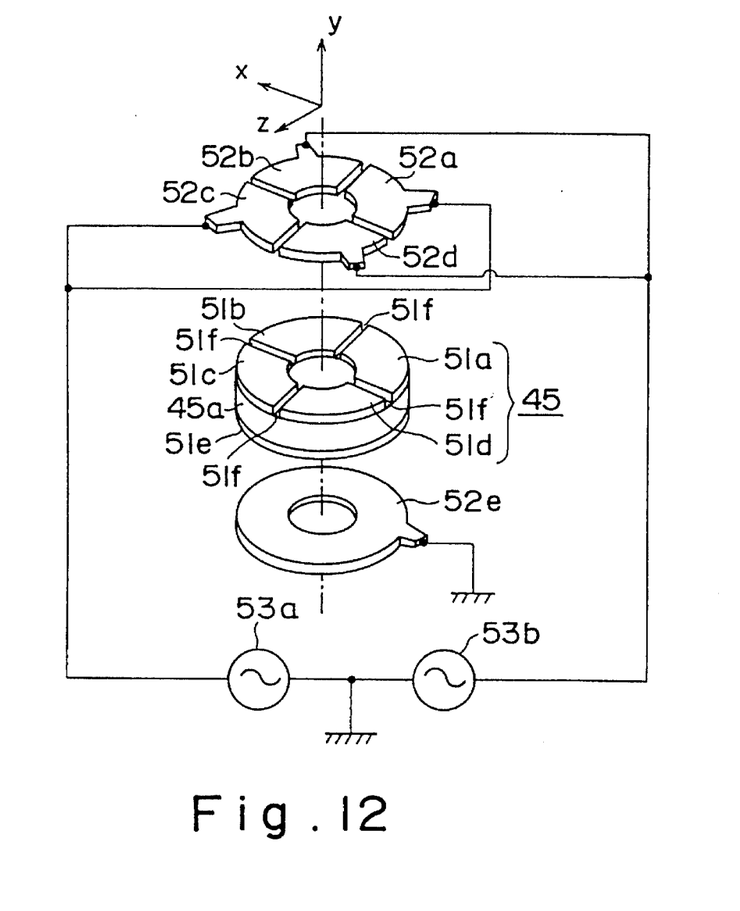
FIG. 12 is a schematic view illustrating the working principle of the electro-mechanical energy transducer element according to the second embodiment of the present invention.

FIG. 12 illustrates a working principle of the electro-mechanical energy transducer element according to the second embodiment of the present invention. In this case, a driving method will be described wherein a pair of polarized portions symmetrical to each other with regard to the y-axis among four polarized portions of the electro-mechanical transducer element are polarized reversely to each other.

In such figure, denoted at 45 is an electro-mechanical energy transducer element, 45a is an element body, 51a to 51e are electrode films, 51f are gaps, 52a to 52e are electrode plates and 53a and 53b are power sources.

The electrode plates 52a to 52e corresponding to the electrode films 51a to 51e of the electro-mechanical energy transducer element 45 are positioned as illustrated to be brought into contact with the electrode plates 52a to 52e respectively. The electrode plates 52a to 52e and the electrode films 51a to 51e are made of same material taking account the efficiency of transmitting vibration from the electro-mechanical energy transducer element 45 to the cylindrical elastic bodies 11 and 12 (FIG. 1). A similar effect also can be obtained by making the electrode plates 52a to 52e of material different from that of the cylindrical elastic bodies 11 and 12. The electrode plates 52a to 52e should be thinner than the element body 45a as much as possible.

Gaps at least larger than the gaps 51f between the electrode films 51a to 51e are formed among the electrode plates 52a to 52d to prevent the same from being brought into contact with one another. It also may be possible to provide insulating materials between the electrode plates 52a to 52d to be incorporated into one piece, thus facilitating positioning the electrode plates 52a to 52e relative to the electrode films 51a to 51e compared with the case employing four individual electrode plates 52a to 52e separately. Each of the electrode plates 52a to 52e has an electrode piece which projects outward to be electrically connected to power sources as illustrated.

The polarity of surfaces of the electrode films 51c and 51d of the four divided polarized portions of the electro-mechanical energy transducer element 45 becomes negative supposing that the polarity of surfaces of the electrode films 51a and 51b is positive. Accordingly, the power sources 53a and 53b supply alternating voltages which are different in phase from each other by 90° to the electrode plates 52a and 52c and to the electrode plates 52b and 52d respectively, the electrode plates 52a and 52c electrically connected to each other being in contact with the electrode films 51a and 51c and the electrode plates 52b and 52d electrically connected to each other being in contact with the electrode films 51b and 51d respectively. Moreover, the values of frequencies of each alternating voltages are set to be conformed to or sufficiently close to the resonance frequencies of the first to fourth vibration modes set forth above. As a result, it is possible to amplify the amplitude of the electro-mechanical energy transducer element 45 to generate rotation or elliptical vibrations at the free ends 11b and 12b of the cylindrical elastic bodies 11 and 12. The amplitude of the rotation or elliptical vibration generated at the free ends 11b and 12b can be controlled by the magnitude, phase difference, frequency, etc. of the alternating voltages applied by the power sources 53a and 53b.

In case the electro-mechanical energy transducer element 45 is composed of an element which can transform mechanical energy into electric energy as well as electric energy into mechanical energy, an alternating voltage is applied to one of the polarized portions of the electro-mechanical energy transducer element 45 to generate a rotation or elliptical vibration while the other polarized portions produce alternating voltages upon reception of stress due to the rotation or elliptical vibration.

Accordingly, each polarized portion of the electro-mechanical energy transducer element 45 is electrically selected to be used for driving the same or for detecting the vibrating state of the same. As a result, it is possible to compensate for a change over time or a change due to an external load in the rotation or elliptical vibration generated at the free ends 11b and 12b of the cylindrical elastic bodies 11 and 12 to stabilize the vibration. It is possible to use the electro-mechanical energy transducer element 45 for driving the same or for detecting the vibrating state of the cylindrical vibrator 10 by way of a selector switch, not shown, which connects the terminals of the polarized portions, not shown, to a control circuit or another power source, not shown.

In the first and second embodiments, an electro-mechanical energy transducer element 14, 45 is provided between the cylindrical elastic bodies 11 and 12 for generating rotation or elliptical vibrations at the free ends 11*b* and 12*b* of the cylindrical elastic bodies 11 and 12. Accordingly, the electro-mechanical energy transducer element 14, 45 requires more than three polarized portions.

Since the magnitude of vibration generated by the electro-mechanical energy transducer element 14, 45 relates to the area of the polarized portions, if the number of divided portions of the electro-mechanical energy transducer element 14, 45 is increased, the area of each divided polarized portion becomes small so that the vibration generated by the electro-mechanical energy transducer element 14, 45 becomes small. Accordingly, it is possible to increase vibration by laminating more than two electro-mechanical energy transducer elements which are divided into polarized portions in the same way. This laminated-type electro-mechanical energy transducer element is driven in the same way as an electro-mechanical energy transducer element 14, 45 by positioning the polarized portions of the laminated-type electro-mechanical energy transducer elements over one another.

An electro-mechanical energy transducer element which is divided into two polarized portion according to a third embodiment of the present invention will be described hereinafter.

Figure 13A:
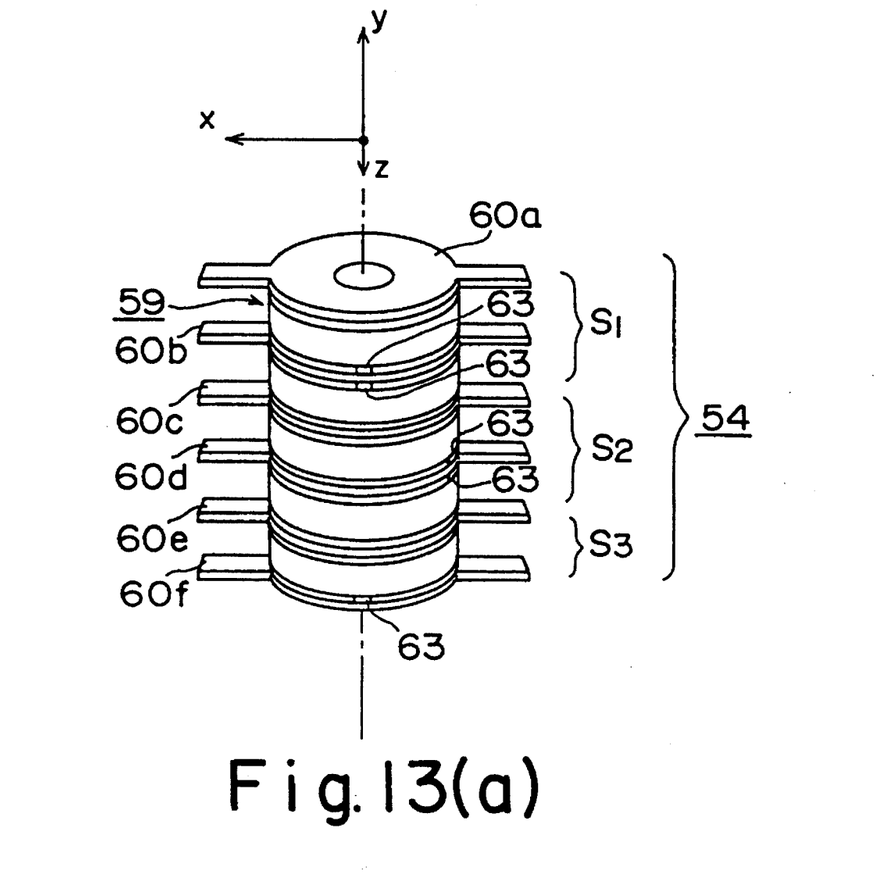
Figure 13B:
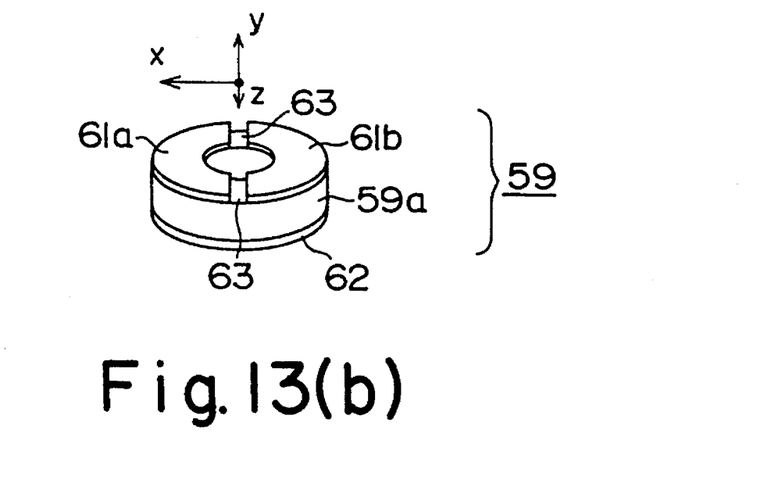
Figure 14:
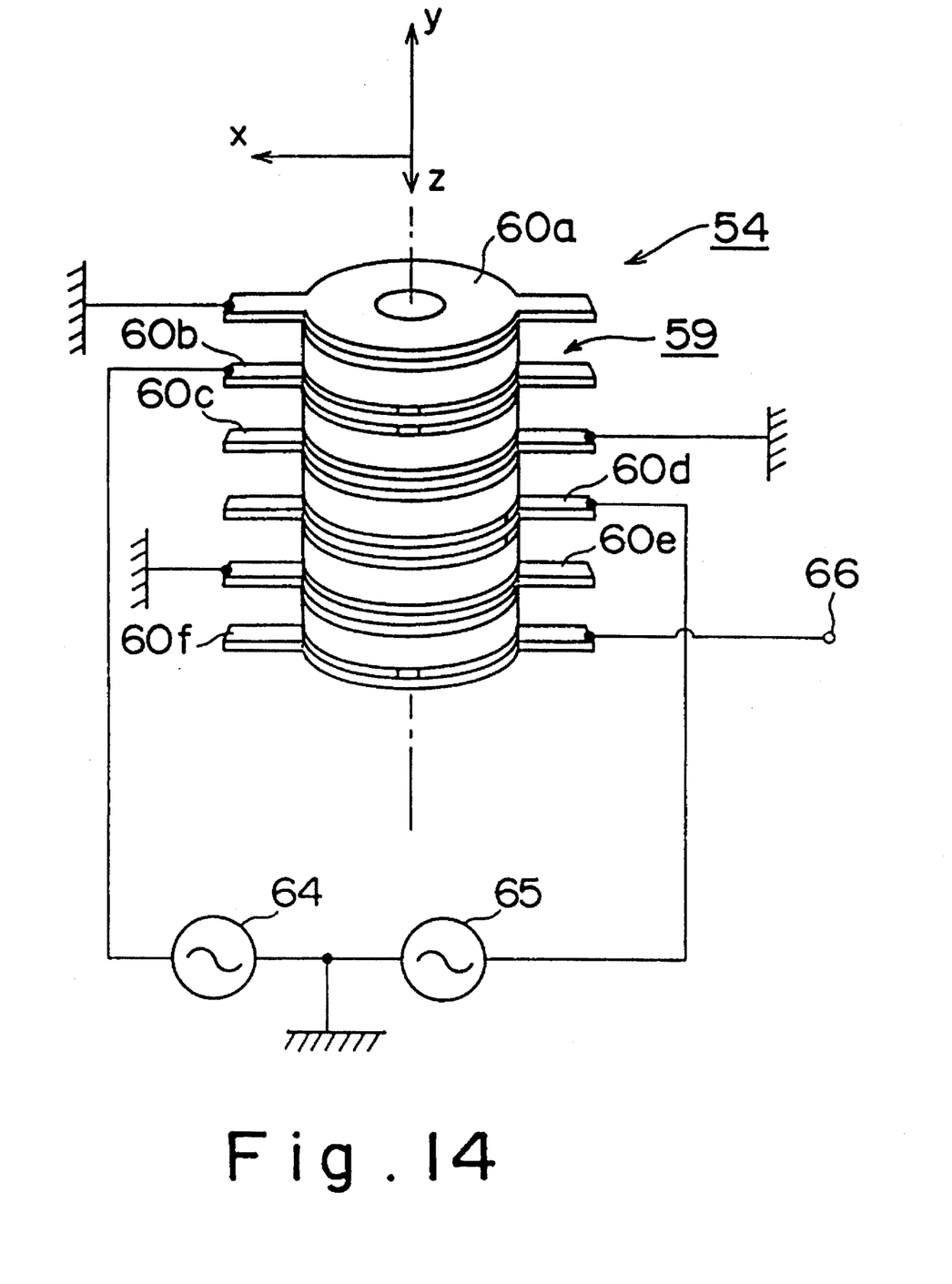
FIG. 14 is a schematic view illustrating the working principle of the laminated-type electro-mechanical energy transducer element according to the third embodiment of the present invention.

FIGS. 13(*a*) and 13(*b*) illustrate construction of a laminated-type electro-mechanical energy composite element according to the third embodiment of the present invention, and FIG. 14 illustrates the working principle of the laminated-type electro-mechanical energy transducer composite element according to the third embodiment of the present invention. FIG. 13(*a*) is a perspective view of the laminated-type electro-mechanical energy transducer composite element, and FIG. 13(*b*) is a perspective view of an individual electro-mechanical energy transducer element.

In this case, an individual electro-mechanical energy transducer element 59 is divided into two polarized portions. Accordingly, it is difficult to stably generate two-dimensional vibration such as a rotation or elliptical vibration by the electro-mechanical energy transducer element 59 alone. As a result, a laminated-type electro-mechanical energy transducer composite element 54 is composed of five individual electro-mechanical energy transducer elements 59 and six electrode plates 60*a* to 60*f*, the two kinds of components being alternatively laminated piece by piece.

The electro-mechanical energy transducer elements 59 and the electrode plates 60*a* to 60*f* set forth above are bonded to one another to form one piece. It is also possible to fix the electro-mechanical energy transducer elements 59 and the electrode plates 60*a* to 60*f* to one another by clamping the same by way of a pair of cylindrical elastic bodies 11 and 12 (FIG. 1) and the stepped cylindrical elastic body 13. In case of the bonding method, not only is rotation or elliptical vibration absorbed by bonding layers but also assembly takes a long time for assembling. But, in case of the clamping method, the rotation or elliptical vibration is not absorbed, and moreover, the time for assembly can be shortened.

Each of the electrode plates 60*a* to 60*f* is made of the same elastic material as that of the cylindrical elastic bodies 11 and 12 and has two electrode pieces on the outer circumference thereof at positions symmetrical with respect to each other. The electro-mechanical energy transducer elements 59 can be easily positioned relative to one another to be laminated it) together with the electrode plates 60*a* to 60*f* sandwiched therebetween by aligning the electrode plates 60*a* to 60*f* using the two electrode pieces thereof as illustrated in FIG. 13(*a*). Moreover, the electrode pieces of the electrode plates 60*a* to 60*f* serve as leads as illustrated in FIG. 14.

The electro-mechanical energy transducer element 59 is composed of an element body 59*a*, semi-circular electrode films 61*a* and 61*b* and a circular electrode film 62. The semi-circular electrode films 61*a* and 61*b* and the circular electrode film 62 are formed by attaching conductive metallic films to the surfaces of the element body 59*a*. It is also possible to form the semi-circular electrode films 61*a* and 61*b* and the circular electrode film 62 by applying conductive coatings to the surfaces of the element body 59*a*.

The element body 59*a* is divided into two by the semi-circular electrode films 61*a* and 61*b*, being polarized in the direction of thickness, wherein the polarity of the surface of the semi-circular electrode film 61*b* becomes negative in case that of the semi-circular electrode film 61*a* is positive. The circular electrode film 62 serves in common as an electrode to make respective pairs with the semi-circular electrode films 61*a* and 61*b* so as to be used as a ground terminal of the laminated-type electro-mechanical energy transducer composite element 54 as illustrated in FIG. 14.

When a dc voltage is applied to the semi-circular electrode films 61*a* and 61*b* while the circular electrode film 62 is grounded, the element body 59*a* expands in the direction of the y-axis or bends in the positive direction of the y-axis on the semi-circular electrode film 61*a* side thereof, while contracts in the direction of the y-axis or bends in the negative direction of the y-axis on the semi-circular electrode film 61*b* side thereof.

On the other hand, when an alternating voltage is applied to the electro-mechanical energy transducer element 59, the semi-circular electrode film 61*a* side portion and semi-circular electrode film 61*b* side portion of the element body 59*a* vibrate with phases different from each other by 180°.

Gaps 63 between the semi-circular electrode films 61*a* and 61*b* serve as marks for indicating directions of alignment or orientation of the electro-mechanical energy transducer elements 59 when the same are laminated together to facilitate efficient assembly of the laminated-type electro-mechanical energy transducer composite element 54 as illustrated in FIG. 13(*a*).

The laminated-type electro-mechanical energy transducer composite element 54 can be divided into three laminated portions S1 to S3 according to the divided direction and function in laminating the electro-mechanical energy transducer elements 59. In the laminated portion S1, the semi-circular electrode films 61*a* and 61*b* of two electro-mechanical energy transducer elements 59 are in contact with an electrode plate 60*b* so that the gaps 63 may be arranged in the direction of the z-axis. On the other hand, in the laminated portion S2, the semi-circular electrode films 61*a* and 61*b* of two electro-mechanical energy transducer elements 59 are in contact with an electrode plate 60*d* so that the gaps 63 thereof may be turned about the y-axis by 90° from those of the laminated portion S1. In the laminated portion S3, The semi-circular electrode films 61*a* and 61*b* of an electro-mechanical energy transducer element 59 are in contact with an electrode plate 60*f* so that the gap 63 thereof may be aligned in the same direction of those of the laminated portion S1. The electrode plates 60*a*, 60*c* and 60*e* are grounded.

In case of vibrating the laminated-type electro-mechanical energy transducer composite element 54, the electrode plates 60*a* to 60*f* are wired as illustrated in FIG. 14. That is, the electrode plates 60*a*, 60*c* and 60*e* are grounded, an alternating voltage is applied to the laminated portion S1 from an power source 64 by way of the electrode plate 60b and an alternating voltage is applied to the laminated portion S2 from an power source 65 by way of the electrode plate 60d.

As a result, a flexural vibration is generated in the x-y plane about the y-axis in the laminated portion S1 caused by the alternating voltage from the power source 64 and a flexural vibration is generated in the x-z plane about the y-axis in the laminated portion S2 caused by the alternating voltage from the power source 65. If two flexural vibrations different in phase from each other by 90° are generated in the laminated portions S1 and S2, a rotation or elliptical vibration is generated about the central axis of the laminated-type electro-mechanical energy transducer composite element 54. For this purpose, alternating voltages which are identical in frequency and different in phase from each other by 90° are applied to the laminated portions S1 and S2 from the power sources 64 and 65 respectively. The amplitude of the rotation or elliptical vibration about the central axis of the laminated-type electro-mechanical energy transducer composite element 54 can be controlled by the magnitude, phase difference, frequency and the like of the alternating voltages applied to the laminated portions S1 and S2 from the power sources 64 and 65.

In case the electro-mechanical energy transducer element 59 is composed of an element which can convert mechanical energy into electric energy as well as electric energy into mechanical energy, an alternating voltage which is proportional to the stress applied to the laminated portion S3 by the rotation or elliptical vibration is output from a terminal 66 connected to the electrode plate 60f, so that it is possible to use the laminated portion S3 as an element for detecting the vibrating state of the laminated-type electro-mechanical energy transducer composite element 54 by connecting the terminal 66 to a control circuit, not shown, to detect the alternating voltage output therefrom.

It is possible to control the laminated-type electro-mechanical energy transducer composite element 54 based on the detected voltage so as to stably vibrate the cylindrical vibrator 10. Moreover, since the gaps 63 of the laminated portion S3 is aligned in the same direction as those of the laminated portion S1, it is possible to vibrate the laminated portion S3 in the x-y plane in the same way as the laminated portion S1. It is also possible to use the laminated portion S3 for driving the same or detecting the vibrating state thereof by way of a selector switch, not shown, which connects the terminal 66 to a control circuit or another power source, not shown.

As described above, when the laminated-type electro-mechanical energy transducer composite element 54 is provided in the cylindrical vibrator 10 as illustrated in FIG. 1, a first vibration mode in FIG. 6(a) or a third vibration mode in FIG. 6(c) are generated therein by being driven by the laminated portion S1, and a second vibration mode in FIG. 6(b) or a fourth vibration mode in FIG. 6(d) are generated therein by being driven by the laminated portion S2. It is possible to amplify the amplitude of the laminated-type electro-mechanical energy transducer composite element 54 to generate rotation or elliptical vibrations at the free ends 11b and 12b of the cylindrical elastic bodies 11 and 12 by setting the frequencies of alternating voltages applied to the laminated portions S1 and S2 to be conformed to or sufficiently close to the resonance frequencies of the first and second vibration modes or the third and fourth vibration modes respectively while setting the phases thereof to be different from each other by 90°.

When the laminated-type electro-mechanical energy transducer composite element 54 is provided in the cylindrical vibrator 10, the electrode plates 60a and 60f are insulated from the cylindrical elastic bodies 11 and 12 respectively.

The amplitude of the rotation or elliptical vibration generated at each of the free ends 11b and 12b can be controlled by the magnitude, phase difference, frequency and the like of the alternating voltages applied to the cylindrical vibrator 10 from the power sources 64 and 65.

The present invention is not limited to the embodiments described above, but can be modified variously based on the spirit of the invention without being excluded from the scope thereof.

As described above, the ultrasonic motor according to the present invention is suitable for a conveying device for conveying prepaid cards used in an automatic cash dispenser, for a telephone, an automatic ticket issuing machine, etc., or papers, films, etc. used in a printer, a facsimile, copier, etc.

I claim:

1. An ultrasonic motor, comprising:

a stepped cylindrical elastic body, said body having opposite ends, a center and attachment portions located on either side of and adjacent to said center of said stepped cylindrical elastic body, wherein said opposite ends comprise respective fixing portions, wherein said attachment portions have diameters larger than the diameters of said opposite ends and wherein said stepped cylindrical body is supported at said fixing portions;

an electro-mechanical energy transducer element fixed to said stepped cylindrical elastic body for generating modes of vibration in a plurality of planes;

a pair of cylindrical elastic bodies clamping said electro-mechanical energy transducer element therebetween, said pair of cylindrical elastic bodies having free ends and being fixed to said stepped cylindrical elastic body by said attachment portions;

means for applying to said electro-mechanical energy transducer element a plurality of alternating voltages that are different from one another by a predetermined phase to thereby generate vibration at said free ends of said cylindrical elastic bodies; and driving rollers pressed on said free ends of said cylindrical elastic bodies so as to be driven to rotate by vibration generated at said free ends.

2. The ultrasonic motor of claim 1; wherein said attachment portions threadedly engage said cylindrical elastic bodies.

3. The ultrasonic motor of claim 1, wherein said pair of cylindrical elastic bodies comprise inner ends adjacent to said electro-mechanical energy transducer element and notched portions between said free ends and said inner ends.

4. The ultrasonic motor of claim 1, wherein said driving rollers extend between respective ones of said pair of cylindrical elastic bodies and said stepped cylindrical elastic body and engage said free ends.

5. The ultrasonic motor of claim 4, wherein said driving rollers further have bearings supporting said driving rollers on said stepped cylindrical elastic body and springs biasing said driving rollers into engagement with said free ends.

6. The ultrasonic motor of claim 1, wherein said electro-mechanical energy transducer element comprises an element body divided into at least three portions that are each polarized in a thickness direction of said element body.

7. The ultrasonic motor of claim 1, wherein said electro-mechanical energy transducer element comprises a plurality of element bodies laminated together, wherein each of said element bodies is divided into at least two portions that are polarized in a thickness direction of said element bodies.

8. The ultrasonic motor of claim 1, wherein said ultrasonic motor further comprises driven rollers that are driven to rotate by said driving rollers such that the amount of force that is capable of being transmitted between said driving rollers and said driven rollers is set to be smaller that the amount of force capable of being transmitted between said free ends of said cylindrical elastic bodies and said driving rollers.

9. An ultrasonic motor, comprising:

a stepped cylindrical elastic body, said body having opposite ends, a center and attachment portions located on either side of and adjacent to said center of said stepped cylindrical elastic body, wherein said opposite ends comprise respective fixing portions, wherein said attachment portions have diameters larger than the diameters of said opposite ends and wherein said stepped cylindrical body is supported at said fixing portions thereof;

an electro-mechanical energy transducer element fixed to said stepped cylindrical elastic body for generating modes of vibration in a plurality of planes;

a pair of cylindrical elastic bodies clamping said electro-mechanical energy transducer element therebetween, said pair of cylindrical elastic bodies having free ends and being fixed to said stepped cylindrical elastic body by said attachment portions;

means for applying to said electro-mechanical energy transducer element a plurality of alternating voltages that are different from one another by a predetermined phase to thereby generate vibration at said free ends of said cylindrical elastic bodies;

driving rollers pressed on said free ends of said cylindrical elastic bodies so as to be driven to rotate by vibration generated at said free ends; and auxiliary rollers facing said driving rollers and arranged relative to said driving rollers so as to be capable of conveying a sheet therebetween while clamping the sheet therebetween.

* * * * *